(12) United States Patent
Wong et al.

(10) Patent No.: US 11,424,597 B2
(45) Date of Patent: Aug. 23, 2022

(54) TUNNEL JUNCTION FOR GAAS BASED VCSELS AND METHOD THEREFOR

(71) Applicant: OEpic SEMICONDUCTORS, INC., Sunnyvale, CA (US)

(72) Inventors: Ping-Show Wong, Sunnyvale, CA (US); Jingzhou Yan, Sunnyvale, CA (US); Ta-Chung Wu, Sunnyvale, CA (US); James Pao, Sunnyvale, CA (US); Majid Riaziat, Sunnyvale, CA (US)

(73) Assignee: OEPIC Semiconductors, Inc., Sunnyvale, CA (US)

( * ) Notice: Subject to any disclaimer, the term of this patent is extended or adjusted under 35 U.S.C. 154(b) by 0 days.

(21) Appl. No.: 15/883,930

(22) Filed: Jan. 30, 2018

(65) Prior Publication Data
US 2018/0241177 A1   Aug. 23, 2018

Related U.S. Application Data

(60) Provisional application No. 62/451,864, filed on Jan. 30, 2017.

(51) Int. Cl.
*H01S 5/30*   (2006.01)
*H01S 5/183*   (2006.01)
*H01S 5/323*   (2006.01)

(52) U.S. Cl.
CPC .......... *H01S 5/3095* (2013.01); *H01S 5/1833* (2013.01); *H01S 5/18313* (2013.01); *H01S 5/18369* (2013.01); *H01S 5/18377* (2013.01); *H01S 5/3054* (2013.01); *H01S 5/32308* (2013.01)

(58) Field of Classification Search
CPC .. H01S 5/3095; H01S 5/18313; H01S 5/3054; H01S 5/18369; H01S 5/32308; H01S 5/18377; H01S 5/1833
See application file for complete search history.

(56) References Cited

U.S. PATENT DOCUMENTS

| | | | |
|---|---|---|---|
| 6,535,541 B1 | 3/2003 | Boucart et al. | |
| 6,765,238 B2 | 7/2004 | Chang et al. | |
| 6,813,293 B2 | 11/2004 | Johnson et al. | |
| 6,931,042 B2 | 8/2005 | Choquette et al. | |
| 2001/0050934 A1* | 12/2001 | Choquette | B82Y 20/00 372/50.11 |
| 2004/0101009 A1* | 5/2004 | Johnson | H01S 5/18308 372/46.013 |
| 2005/0253222 A1* | 11/2005 | Caneau | B82Y 20/00 257/607 |
| 2006/0193361 A1* | 8/2006 | Casimirus | B82Y 20/00 372/68 |
| 2007/0013996 A1* | 1/2007 | Verma | B82Y 10/00 359/344 |
| 2008/0254566 A1* | 10/2008 | Yokouchi | B82Y 20/00 438/93 |

* cited by examiner

*Primary Examiner* — Yuanda Zhang
(74) *Attorney, Agent, or Firm* — Weiss & Moy, P.C.; Jeffrey D. Moy

(57) ABSTRACT

A vertical-cavity surface-emitting laser (VCSEL) has a substrate formed of GaAs. A pair of mirrors is provided wherein one of the pair of mirrors is formed on the substrate. A tunnel junction is formed between the pair of mirrors.

8 Claims, 5 Drawing Sheets

FIG. 6A
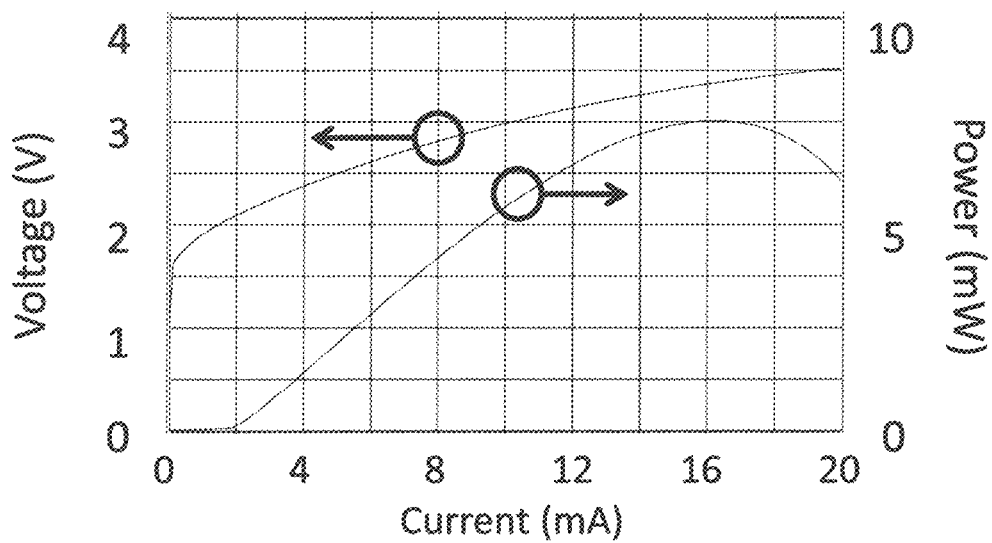
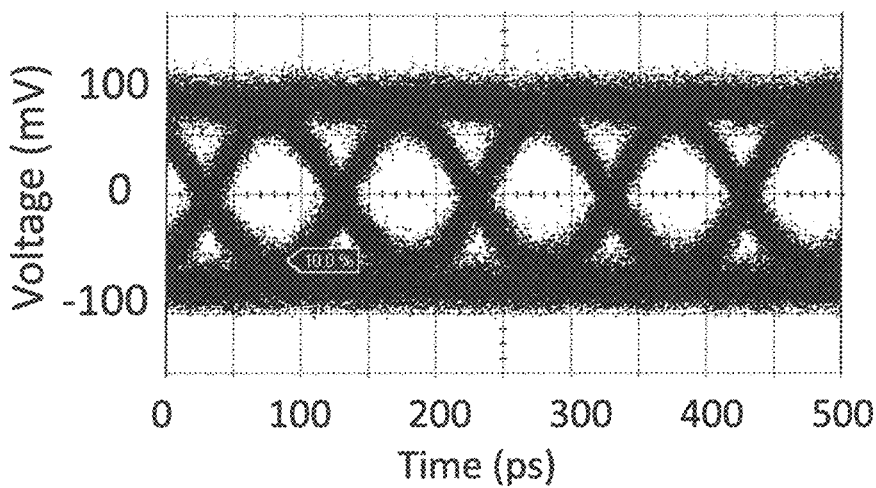
FIG. 6B

TUNNEL JUNCTION FOR GAAS BASED VCSELS AND METHOD THEREFOR

RELATED APPLCIATIONS

This patent application is related to U.S. Provisional Application No. 62/451,864 filed Jan. 30, 2017, entitled "TUNNEL JUNCTION 850-NM VCSEL FOR UNIFORMITY AND RELIABILTY" in the name of the same inventors, and which is incorporated herein by reference in its entirety. The present patent application claims the benefit under 35 U.S.C § 119(e).

TECHNICAL FIELD

The present application relates generally to the technical field of laser diodes, and more specifically, to the technical field of vertical cavity surface emitting semiconductor lasers built on GaAs substrates.

BACKGROUND

A junction formed at the boundary between a negatively doped (n-type) and a positively doped (p-type) semiconductor may be known as a p-n junction and it may form a diode that allows current flow in one direction only, known as the forward direction. Reverse direction current is blocked. If the doping level in the two semiconductor regions is increased heavily (denoted as p++ and n++ doping) then the reverse current can "tunnel" through and the junction becomes a "tunnel junction". Tunnel junctions are used in multijunction solar cells in order to be able to stack solar cell p-n junctions in the same polarity direction. The tunnel junction allows the switching from p-type to n-type semiconductor without forming a rectifying junction.

A vertical-cavity surface-emitting laser (VCSEL) is a type of semiconductor laser diode where laser beam emission is perpendicular to the surface of the wafer, contrary to conventional edge-emitting semiconductor lasers where the laser beam may emit from surfaces formed by cleaving the individual chip out of a wafer. VCSEL applications include fiber optic communications, precision sensing, computer mice and laser printers, and invisible illumination.

In a VCSEL, the tunnel junction can be used to form two functions: (1) to convert the p-type mirror stack to an n-type mirror stack for reduced optical loss and improved electrical resistance; and (2) to create an aperture to confine lateral current flow and to limit the optical modes. The second function is currently done with an oxide aperture in most VCSELs.

Most GaAs based VCSELs have a current-limiting aperture which may be formed by the oxidation of a semiconductor layer that gets converted to aluminum oxide in a controlled wet oxidation process. Other VCSELs may use ion implantation to form the aperture. For longer wavelength VCSELs built on InP substrates, tunnel junctions have been used to form the aperture. No successful tunnel junction VCSEL products have been reported in shorter wavelength GaAs based VCSELs.

The above methodologies all have drawbacks. Oxide apertures tend to have some diameter nonuniformity over the wafer, and also may induce strain into the crystal lattice, with long term reliability ramifications. Ion implantation is less precise and is generally used for larger apertures and lower data rate devices. Low-resistance tunnel junctions suitable for VCSELs have been fabricated with InP family of materials, but not with materials lattice matched to GaAs.

Tunnel junctions have also been built for use in multifunction solar cells on GaAs, but series resistance requirements are less strict for solar cells.

Therefore, it would be desirable to provide a system and method that overcomes the above.

SUMMARY

In accordance with one embodiment, a vertical-cavity surface-emitting laser (VCSEL) is disclosed. The VCSEL has a substrate formed of GaAs. A pair of mirrors is provided, wherein one of the pair of mirrors is formed on the substrate. A tunnel junction is formed between the pair of mirrors.

In accordance with one embodiment, a vertical-cavity surface-emitting laser (VCSEL) is disclosed. The VCSEL has a substrate formed of GaAs. A first multilayer mirror if formed on the substrate. An active region is formed on the first mirror. A second multilayer mirror is formed on the active region. A tunnel junction is formed in one of below or within a first few layers of the second mirror. A metal layer is formed on the second mirror. An opening is formed in the metal layer.

In accordance with one embodiment, a vertical-cavity surface-emitting laser (VCSEL) is disclosed. The VCSEL has a substrate. A first mirror is formed on the substrate. An active region is formed on the first mirror. A second mirror is formed above the active region. A tunnel junction is formed above the active region within the first few layers of the second mirror. A metal layer is formed on the second mirror. An opening is formed in the metal layer. The tunnel junction has a p-layer and an n-layer formed on the p-layer, wherein Tellurium is used as an n++ dopant in the n-layer.

In accordance with one embodiment, a vertical-cavity surface-emitting laser (VCSEL) is disclosed. The VCSEL has a substrate. A first mirror is formed on the substrate. An active region is formed on the first mirror. A second mirror formed above the active region. A tunnel junction is formed within the second mirror. The tunnel junction comprises a p-layer and an n-layer formed on the p-layer, wherein Tellurium is used as an n++ dopant in the n-layer.

BRIEF DESCRIPTION OF THE DRAWINGS

The present application is further detailed with respect to the following drawings. These figures are not intended to limit the scope of the present application but rather illustrate certain attributes thereof. The sane reference numbers will be used throughout the drawings to refer to the same or like parts.

FIG. 6A is the current-voltage behavior of a tunnel junction vertical cavity surface emitting laser fabricated according to the current invention; and FIG. 6B is the response to a 10 Gbps modulation signal of a vertical cavity surface emitting laser built according to the current invention.

DESCRIPTION OF THE APPLICATION

The description set forth below in connection with the appended drawings is intended as a description of presently preferred embodiments of the disclosure and is not intended to represent the only forms in which the present disclosure can be constructed and/or utilized. The description sets forth the functions and the sequence of steps for constructing and operating the disclosure in connection with the illustrated embodiments. It is to be understood, however, that the same or equivalent functions and sequences can be accomplished by different embodiments that are also intended to be encompassed within the spirit and scope of this disclosure.

Buried tunnel junctions (BTJs) VCSELs may offer significant performance advantages over oxide-aperture VCSELs, by using a laterally structured TJ within the p-side of the laser. To name a few: (1) higher emission uniformity can be attained over large-area VCSEL arrays since the apertures dimensions are defined precisely by lithography; (2) small-aperture devices can be fabricated more reproducibly; (3) devices are expected to have higher reliability since there is no strained oxide layer within the semiconductor matrix; (4) the majority of the p-side distributed Bragg reflector (DBR) layers are converted to n-doped materials resulting in lower electrical resistance of the DBR and lower free carrier absorption.

To design a TJ for GaAs-based VCSELs one should consider multiple parameters. First, to achieve abrupt junctions, one should work with n-type dopants other than silicon. Second, one should try to minimize free carrier absorption due to highly doped p+/n+ layers needed for low resistivity. Finally, one should select a proper layer thickness, and to ensure the compatibility with the regrowth of n-doped materials and other VCSEL fabrication processes. Taking the above into consideration, one may successfully fabrication VCSELs with buried TJ structures.

Figure 1:
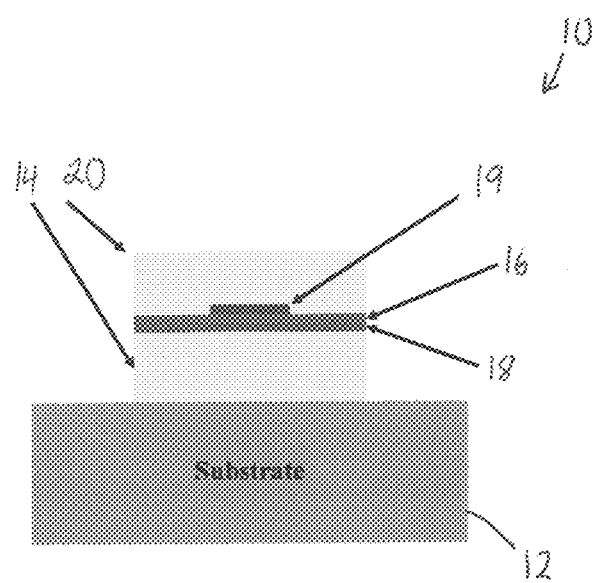
FIG. 1 shows a buried tunnel junction (BTJ) for use in a vertical cavity surface-emitting laser.

Referring to FIG. 1, a BTJ VCSEL 10 is shown. The BTJ VCSEL 10 may have a substrate 12. A distributed Braggs reflector 14 and a few layers of a distributed Bragg reflector 16 may be formed thereon. The distributed Braggs reflectors 14 and 16 run parallel to the substrate 12. An active region 18 may be formed between the pair of distributed Braggs reflectors 14 and 16. The active region 18 may be formed of one or more quantum wells for laser light generation. The planar pair of DBRs 14 and 16 may consist of layers with alternating high and low refractive indices. Each layer may have a thickness of a quarter of the laser wavelength in the material, yielding intensity reflectivities above 99%. A third DBR 20 may be provided. The third DBR 20 may be formed on the second DBR 16. The third DBR 20 is generally thicker than the second DBR 16. The third DBR 20 may be doped as a N-type DBR. The combination of the second DBR 16 and the third DBR 20 form what may be called the top mirror of the BTJ VCSEL 10, while the first DBR 14 may be called the bottom mirror of the BTJ VCSEL 10.

In an oxide aperture VCSEL, there is normally a top DBR and a bottom DBR. The top DBR is normally P type and the bottom DBR is normally N type. However, in a BTJ VCESL10, the DBR 14 is normally an N-type and the DBR 20 is N-type as well. It should be noted that a part, or one of the DBRs 14 and/or 20 may also be made of a dielectric material instead of a semiconductor. It should further be noted that the above is given as an example and the BTJ VCSEL 10 may be fabricated in other manners such as upside down from the present embodiment.

A tunnel junction 19 may be formed on the partial DBR 16 close to the active region 18.

Figure 2:
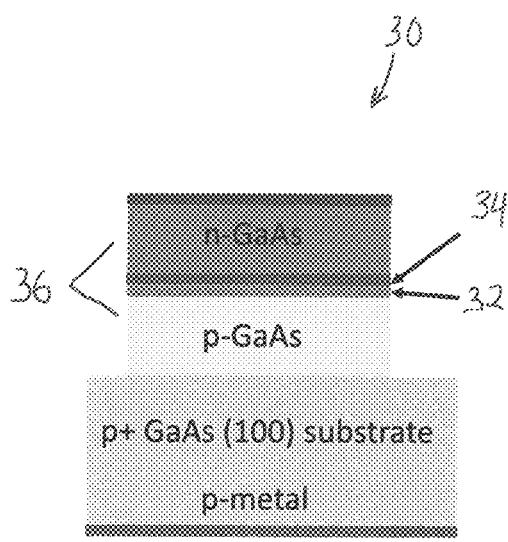
FIG. 2 is a cross section view of a test device used to characterize properties of a tunnel junction.

Referring to FIG. 2, a tunnel junction verification structure 30 (TJ verification structure 30) may be seen. A sample growth may be carried out using a low-pressure (100 torr) metal-organic chemical-vapor deposition (MOCVD) reactor with trimethylaluminum, trimethylgallium, trimethylindium, arsine, phosphine, disilane, diethyltelluride, and carbontetrabromide. The TJ verification structure 30 may be formed by a p++ layer 32, which may be formed of GaAs:C, AlGaAs:C, InGaP:C or the like and an n++ layer 34, which may be formed of GaAs:Te, AlGaAs:Te, InGaP:Te, or the like. The p++ layer 32 and the n++ layer 34 may be sandwiched between a GaAs p-n junction 36. Mesas of various shapes and sizes were etched to facilitate current confinement for the current-voltage (I-V) measurement.

Figure 3:
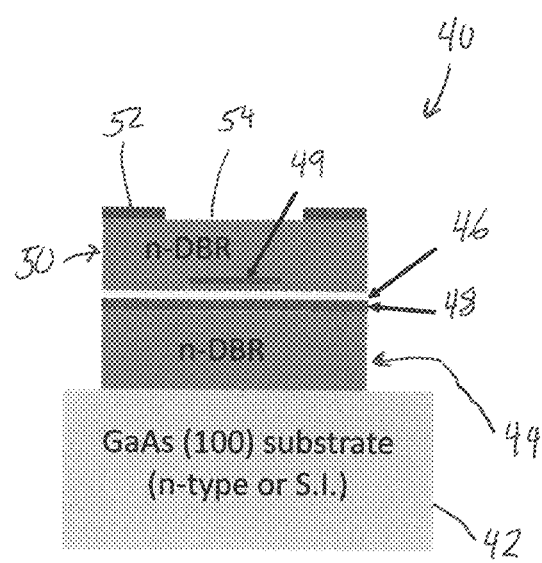
FIG. 3 is the cross section of a vertical cavity surface emitting laser with a buried tunnel junction aperture of the present invention.

Based on the TJ verification structure 30, a BTJ VCSEL was grown, whose schematic may be seen in FIG. 3. The electrical and optical properties of the VCSEL, were then characterized.

As may be seen in FIG. 3. the BTJ VCSEL 40 may have a substrate 42. The substrate 42 may be a GaAs type substrate. A pair of distributed Braggs reflectors 44 and 46 may be formed thereon. The distributed Braggs reflectors 44 and 46 may run parallel to the substrate 40. An active region 48 may be formed between the pair of distributed Braggs reflectors 44 and 46. The active region 48 may be formed of one or more quantum wells for laser light generation.

The planar pair of DBRs 44 and 46 may consist of layers with alternating high and low refractive indices. Each layer may have a thickness of a quarter of the laser wavelength in the material, yielding intensity reflectivities above 99%. A third DBR 50 may be provided. The third DBR 50 may be formed on the second DBR 46 and the tunnel junction 49. The third DBR 50 is generally thicker than the second DBR 46. The third DBR 50 may be doped as a N-type DBR. The combination of the second DBR 46 and the third DBR 50 form what may be called the top mirror of the BTJ VCSEL 40, while the first DBR 44 may be called the bottom mirror of the BTJ VCSEL 40. In accordance with one embodiment, the DBR 44 may be doped as an N-type DBR and the DBR 46 may be dopes as a P-type DBR.

A tunnel junction 49 may be formed on the DBR 46. A metal layer 52 may be formed on the DBR 50. An opening 54 may be formed in the metal layer 52.

Figure 4:
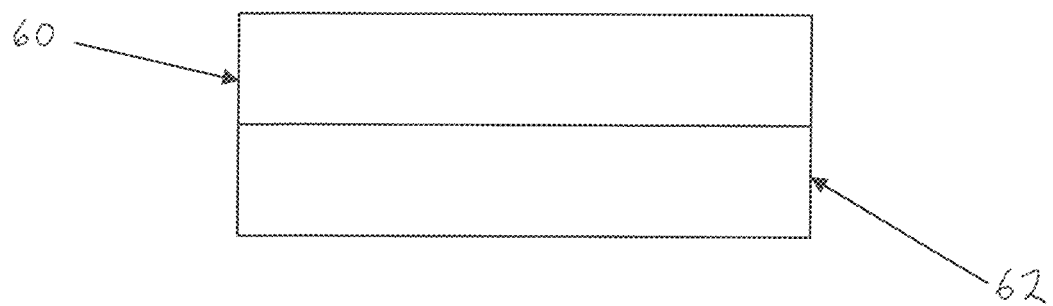
FIG. 4 is the tunnel junction of the vertical cavity surface emitting laser with a buried tunnel junction aperture of the present invention.

Based on the TJ verification structure 30, the tunnel junction 48 as shown in FIG. 4 may be formed of TJ n++ and p++ layers 60 and 62. The TJ n++ and p++ layers 60 and 62 can be the combination of the following materials: GaAs, AlGaAs, and InGaP. The AlGaAs of all compositions is closely lattice-matched to GaAs, and InGaP can also be lattice-matched to GaAs when the Indium composition is about 50%. The AlGaAs has the highest achievable carbon doping level among the three materials (p>1E20 $cm^{-3}$), resulting in stronger TJ behavior, and thus is the most beneficial material for the TJ p++ layer 62. On the other hand, comparable Tellurium doping levels can be achieved for all three materials (n>2E19 $cm^{-3}$), and thus the below includes all three materials as the TJ n++ layer 60.

Figure 5:
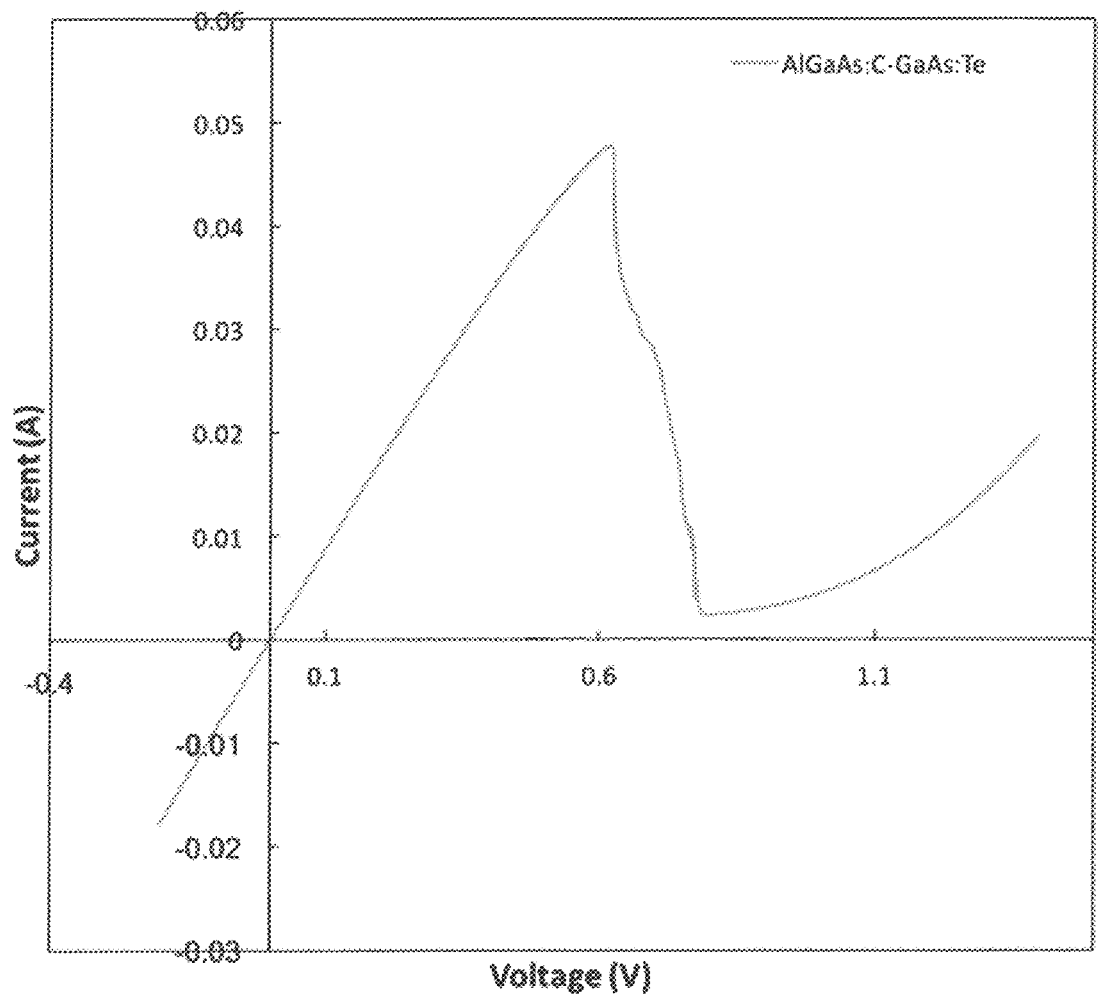
FIG. 5 is the voltage-current behavior of a Te doped tunnel junction.

Referring to FIG. 5, measured I-V characteristics of the AlGaAs:C—GaAs:Te, tunnel junction, may be seen where the large peak to valley ratio can be clearly observed. Under the forward bias, the tunneling peak-to-valley ratio is 20 or more. Under the reverse bias, where the TJ operates in a BJ VCSEL, the series resistance through a mesa of 10 microns in diameter is 11 ohms or less. Prior art tunnel junctions that do not use Te doping have a higher series resistance.

The employment of Te as the n-type dopant, instead of the more commonly used Si, may be used to enable high n-type doping levels (n>2E19 cm$^{-3}$), which is essential for the TJ behavior. While the n++ GaAs:Te layer may have optical absorption at 850 nm, a higher n-type doping level and lower sheet resistance, compared to an n++ AlGaAs:Te layer, can be obtained.

Referring to FIG. 6A, the measured LIV characteristics of the BTJ VCSEL with a mesa diameter of 34 microns and aperture diameter of 8 microns may be seen. The peak power is 7.5 mW, with a series resistance of 60 ohms.

FIG. 6B shows the eye diagram of this BTJ VCSEL, where the 10 Gb/s operation is demonstrated. The rise time and fall time are 57 ps and 81 ps, respectively.

It may be estimated that the series resistance of a typical oxide aperture to be about 1.3-3.0 ohms, depending on the AlGaAs composition, doping level, and the aperture diameter. The series resistance of the BTJ is in the comparable range. On the other hand, the sheet resistance of the replaced p-DBR in the BTJ VCSEL is more than three times higher than the n-DBR replacing it. Combining these two factors, BTJ's electrical properties can be quite comparable or even better than that of VCSELs with oxide apertures. At the same time, the lithographically-defined aperture sizes in BTJ VCSEL excel in uniformity and reproducibility compared to oxide apertures, which are especially critical when the aperture size becomes smaller From the above, with proper tunnel junction design, the aperture of a short wavelength IR VCSEL on GaAs can be fabricated with a tunnel junction for precise control and reproducibility. It may further be shown that the high speed performance of the VCSEL is not compromised.

The foregoing description is illustrative of particular embodiments of the application, but is not meant to be a limitation upon the practice thereof. The following claims, including all equivalents thereof, are intended to define the scope of the application.

What is claimed is:

1. A vertical-cavity surface-emitting laser (VCSEL) comprising:
   a substrate formed of GaAs;
   a pair of mirrors, wherein the pair of mirrors comprises:
   a bottom N-type mirror formed on the substrate; and
   a top mirror, wherein the top mirror has a bottom section attached to a top section, the top section of the top mirror being an N-type top section and the bottom section being a P-type bottom section;
   a tunnel junction formed between the bottom section and the top section of the top mirror, the tunnel junction formed directly on the bottom section of the top mirror, wherein the tunnel junction comprises:
   a p-layer formed directly on the bottom section of the top mirror and having a p++ dopant; and
   a n-layer formed on the p-layer, wherein Tellurium is used as an n++ dopant in the n-layer;
   wherein the p-layer and the n-layer of the tunnel junction are formed of GaAs, AlGaAs, or InGaP; and
   wherein the n++ dopant exceeds doping levels of 2E19 cm$^{-3}$ and the p++ dopant exceeds doping levels greater than 1E20 cm$^{-3}$.

2. The VCSEL of claim 1, wherein Carbon is used as the p++ dopant in the p-layer.

3. The VCSEL of claim 1, comprising: an active region formed between the pair of mirrors.

4. The VCSEL of claim 3, comprising:
   a metal layer formed on the top section of the top mirror; and
   an opening formed in the metal layer.

5. A vertical-cavity surface-emitting laser (VCSEL) comprising:
   a substrate;
   a first mirror formed on the substrate, the first mirror being a first N-type mirror;
   an active region formed on the first mirror;
   a second mirror formed above the active region, the second mirror comprising:
   a bottom mirror section formed on the active region; and
   a top mirror section formed on and attached to the bottom mirror section, the top mirror section being a second N-type mirror; and
   a tunnel junction formed directly on the bottom mirror section of the second mirror;
   wherein the tunnel junction comprises:
   a p-layer formed directly on the bottom mirror section, wherein Carbon is used as a p++ dopant in the p-layer; and
   an n-layer formed on the p-layer, wherein Tellurium is used as an n++ dopant in the n-layer and exceeds doping levels of 2E19 cm$^{-3}$ and carbon is used as the p++ dopant in the p-layer and has doping levels greater than 1E20 cm$^{-3}$;
   wherein the p-layer and the n-layer of the tunnel junction are formed of GaAs, AlGaAs, or InGaP.

6. The VCSEL of claim 5, comprising:
   a metal layer formed on the second mirror; and
   an opening formed in the metal layer.

7. The VCSEL of claim 5, wherein Carbon is used as a p++ dopant in the p-layer.

8. The VCSEL of claim 5, wherein the substrate is formed of GaAs.

* * * * *